United States Patent

Tanaka et al.

[15] 3,673,680

[45] July 4, 1972

[54] METHOD OF CIRCUIT BOARD WITH SOLDER COATED PATTERN

[72] Inventors: Edward Y. Tanaka, Huntington Beach; Darrel D. Cossaart, Garden Grove; Norman B. Edwards, Placentia, all of Calif.

[73] Assignee: California Computer Products, Inc., Anaheim, Calif.

[22] Filed: Dec. 14, 1970

[21] Appl. No.: 97,615

[52] U.S. Cl. ....................29/626, 174/68.5, 156/3, 204/15

[51] Int. Cl. ....................H05k 1/18, H05k 3/24

[58] Field of Search ....................174/68.5; 317/101 B, 101 CC, 317/101 CM; 29/625–627, 502, 630 B; 204/15, 16; 156/3; 117/212

[56] References Cited

UNITED STATES PATENTS 3,002,481 10/1961 Hutters ....................174/68.5 UX

*Primary Examiner*—Darrell L. Clay

*Attorney*—John A. Duffy and Bruce D. Jimerson

[57] ABSTRACT

Printed wiring boards can be fabricated so as to leave a relatively thick solder layer where electrical and mechanical connections are required. Individual soldering operations can be eliminated using any one of several batch reflow soldering techniques.

7 Claims, 15 Drawing Figures

EDWARD Y. TANAKA
DARREL D. COSSAART
NORMAN B. EDWARDS
INVENTORS.

BY Bruce D. Jimerson

ATTORNEY.

EDWARD Y. TANAKA
DARREL D. COSSAART
NORMAN B. EDWARDS
INVENTORS.

BY Bruce W. Jamieson

ATTORNEY.

EDWARD Y. TANAKA
DARREL D. COSSAART
NORMAN B. EDWARDS
INVENTORS.

BY [signature]

ATTORNEY.

METHOD OF CIRCUIT BOARD WITH SOLDER COATED PATTERN

BACKGROUND OF THE INVENTION

Conventional printed wiring boards can be formed by a process which leaves a thin layer of electroplated solder in a prescribed pattern on the surface of the board. Components are attached to the board via terminals which fit through plated holes in the board. Interconnections between these components are usually made by soldering the component terminals to the printed wiring board and/or using wire wrap busing. Since it may be undesirable to solder coat terminals in the vicinity of the wire wrap, interconnections are usually made by conventional hand soldering operations or by subsequent batch melting of solder preforms which have been physically positioned on the desired terminal areas. These operations are costly in terms of the human time required. What is actually desired is a method for making printed wiring boards wherein component interconnections can be made without mechanically placing solder preforms onto the assembly or hand soldering. Accordingly a primary object of the present invention is to provide a printed wiring board having a deposited layer of solder which can be remelted to make the requisite connections to component terminals.

Another object of the present invention is to provide a method for forming printed wiring boards to deposit extra solder at desired points, especially where components are to be attached.

A further object of the invention is to provide a method for making printed wiring board connections in a single operation.

Other objects and advantages of the present invention will be obvious from the detailed description of a preferred embodiment given herein below.

SUMMARY OF THE INVENTION

The method of forming a printed wiring board so as to achieve the above objections comprises the special process of plating a thick layer of solder at those locations where connections to a component terminals are required. These additional steps are performed after the printed wiring solder pattern has been laid down - but before the copper has been etched away.

DESCRIPTION OF THE DRAWINGS:

FIG. 1*a* shows the board after the first step of rolling on a uniform layer of copper.

FIG. 1*b* shows a cutaway cross section of the board after the holes for the component terminals have been drilled.

FIG. 1*c* shows a cutaway cross section of the board after it has been copper plated.

FIG. 1*d* shows a perspective of the board after the electroplated solder pattern has been laid down.

FIG. 1*e* shows a cutaway cross section of the same stage illustrated in FIG. 1*d*.

FIG. 1*f* shows a cutaway cross section of the same board after the copper has been etched away.

FIG. 2*a* shows a cutaway cross section of the fiber board after the copper sheet has been rolled on.

FIG. 2*b* shows a cutaway cross section of the board with the drilled holes oversized.

FIG. 2*c* shows the same board after the copper plating.

FIG. 2*d* shows the same board after the first phase of electroplating solder.

FIG. 2*e* shows the same board after the second phase of electroplating.

FIG. 2*f* shows the board after the etching process.

FIG. 2*g* shows a perspective of the board with an attached component.

FIG. 2*h* shows how the extra layer of solder deposited during the second phase of the electroplating is reflowed to make solder connections with the component terminals.

DESCRIPTION OF PREFERRED EMBODIMENT

Figure 1A:
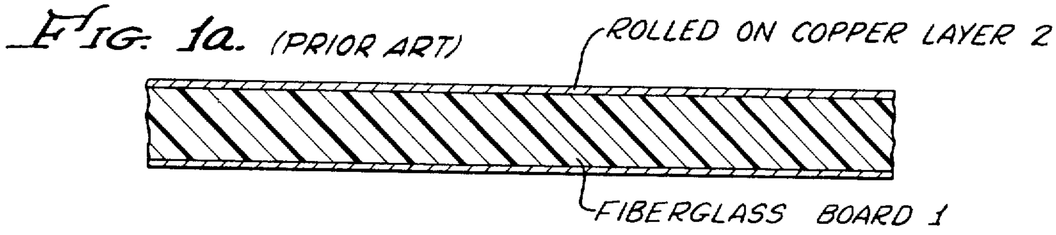
FIG. 1a. (PRIOR ART)
FIGS. 1*a* – 1*f* show in sequence the various stages in the manufacture of a conventional Prior art printed wiring board as follows.
Figure 1B:
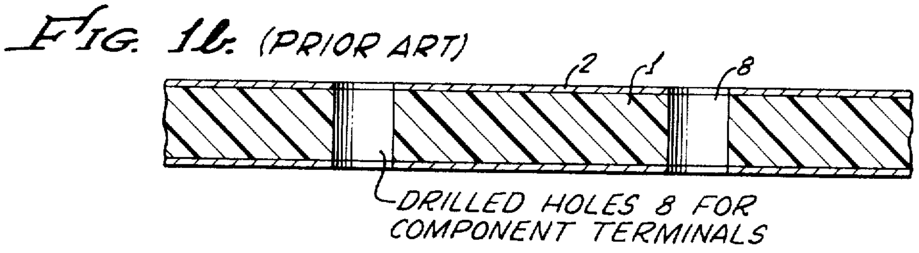
FIG. 1b. (PRIOR ART)
Figure 1C:
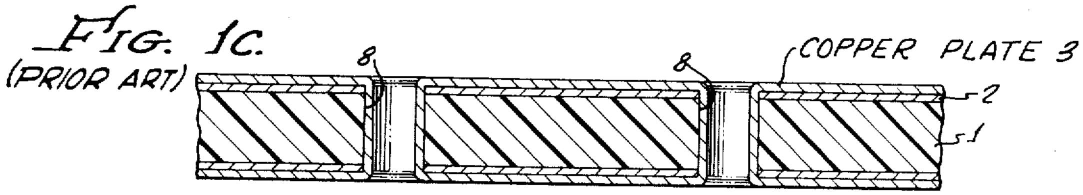
FIG. 1c. (PRIOR ART)
Figure 1D:
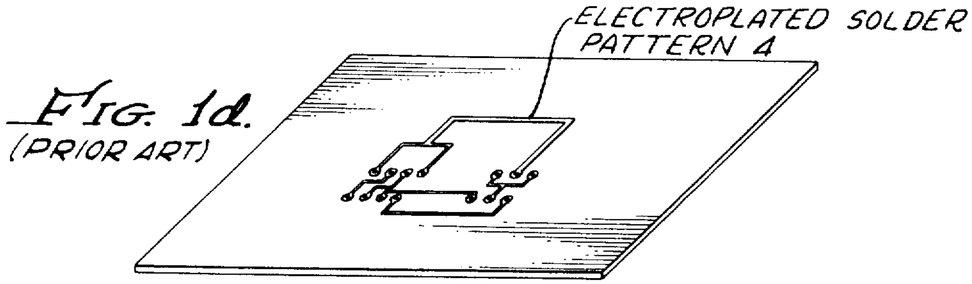
FIG. 1d. (PRIOR ART)
Figure 1E:
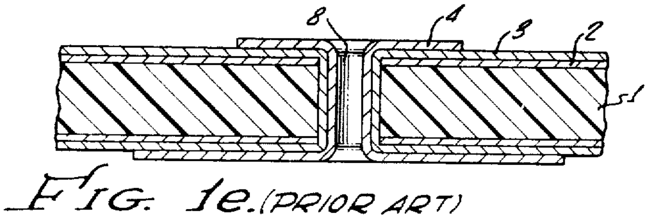
FIG. 1e. (PRIOR ART)
Figure 1F:
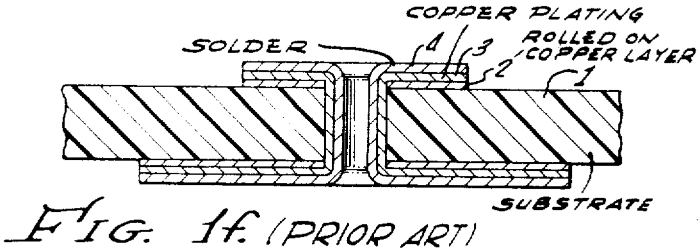
FIG. 1f. (PRIOR ART)

Adverting to the drawings the various stages in the formation of a conventional printed wiring board are illustrated in FIGS. 1*a* – 1*f*. In this process, a thin sheet of copper 2, having a thickness of approximately 1.5 × $10^{-3}$ inches, is first rolled onto, and bonded to, the surface of an electrically insulating substrate 1 having a thickness of approximately one-sixteenth of an inch. After this step the board appears as shown in FIG. 1*a*. The holes 8 for the component terminals are next drilled as shown in FIG. 1*b*. For components having 0.025 square terminals, the hole diameter is approximately 0.049 inches. The board is next completely plated with a copper coating 3 as shown in FIG. 1*c*. The thickness of this coating is approximately 0.001 inches. After this operation the solder pattern 4 is electroplated on the surface of the plated copper. The thickness of this pattern is usually between 0.3 × $10^{-3}$ and 0.7 × $10^{-3}$ inches. FIG. 1*d* illustrates in perspective how the board might appear at this stage of the fabrication. FIG. 1*e* shows a cross section of the board taken through one of the component holes 8. The board is next immersed in a chemical solution which reacts with the exposed copper layers 2 and 3 but not the electroplated solder. As a result the copper not covered by the solder is etched away leaving a conductor pattern in accordance with that laid down by the electroplated solder operation. A cross section of the board at this stage is illustrated in FIG. 1f.

Figure 3:
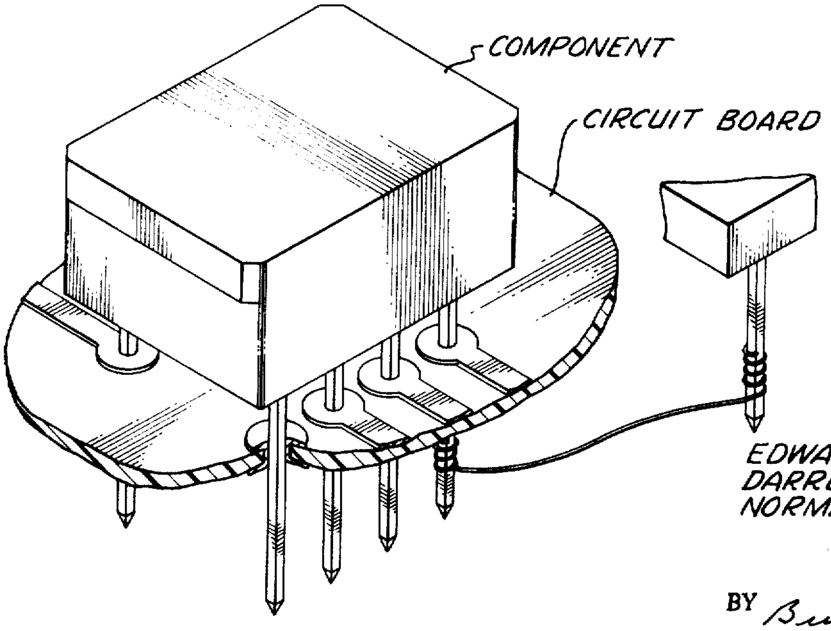
FIG. 3 shows a conventional wire wrap interconnection.

In a typical application, the electroplated solder on a board constructed in accordance with this conventional process functions primarily as a means for providing an etching resist pattern and to protect the copper from destructive corrosion. The interconnection between the component leads and the printed wiring board is accomplished by the external addition of solder. Other interconnecting signal wiring can be accomplished using wire wrap techniques. An example of a typical wire wrap is illustrated in FIG. 3. A primary reason for not including printed wiring signal interconnections as a part of the total wiring of the assembly is due to the time required in performing the individual soldering operations, or the cost required to mechanically load solder preforms onto the assembly. In the present invention all of the soldering connections are made at once without the mechanical loading of solder preforms to the assembly. The board can thus be fabricated to include the solder required to perform the wiring interconnections.

Figure 2A:
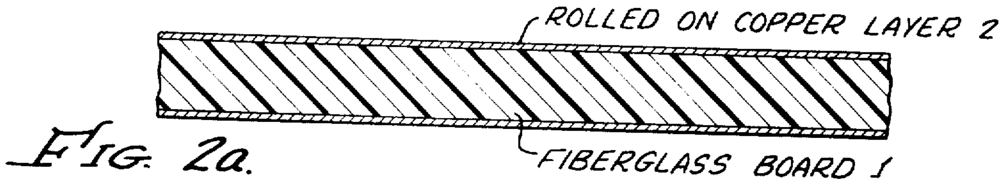
FIGS. 2*a* – 2*h* show in sequence the steps in the manufacture of a printed wiring board in accordance with the present invention as follows.
Figure 2B:
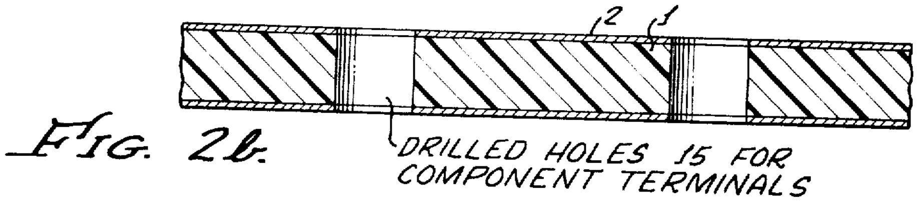
Figure 2C:
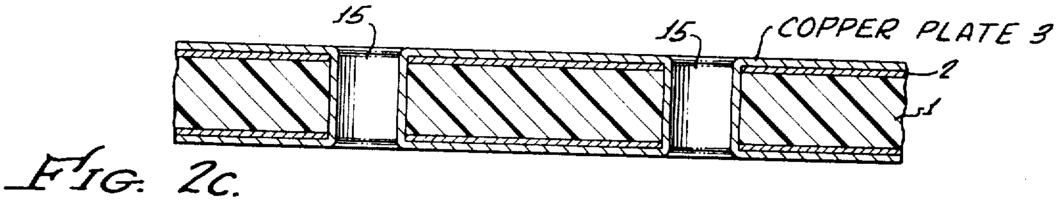
Figure 2D:
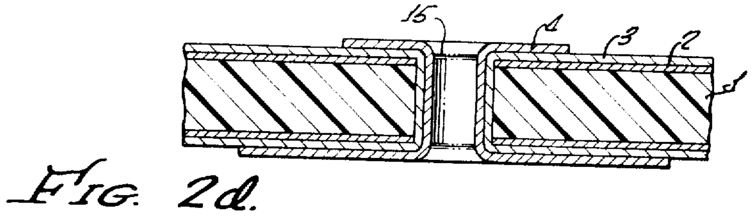

Referring now to FIGS. 2*a* – 2*e*, a preferred process for manufacturing printed wiring boards comprises the steps of rolling on a uniform layer of copper 2 (stage shown in FIG. 2*a*); drilling oversized holes 15 having a diameter of approximately 0.059 inches for component terminals of 0.025 square cross section (stage shown in FIG. 2*b*); copper plating 3 the entire board (stage shown in FIG. 2*c*); and electroplating the desired solder pattern 4 (including signal interconnection), the board at this stage being shown in FIG. 2d.

Figure 2E:
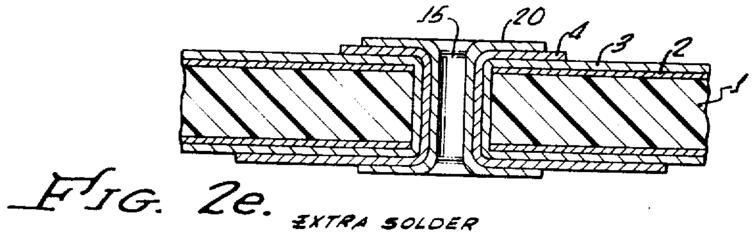
Figure 2F:
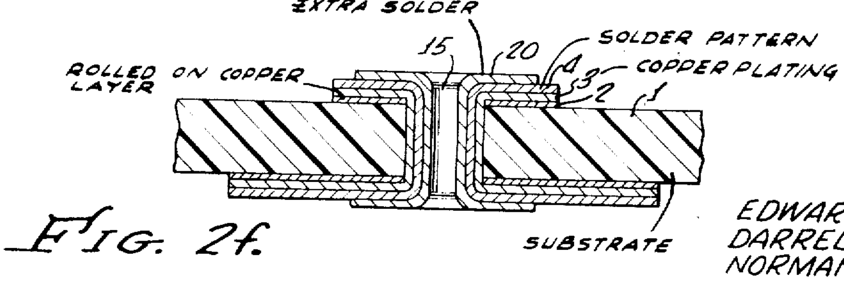
Figure 2G:
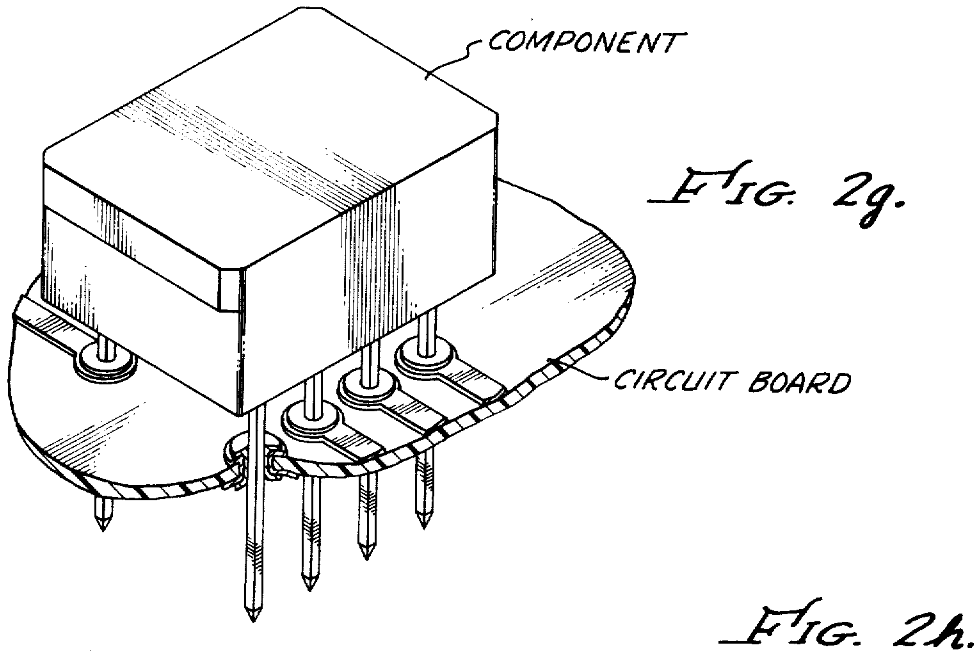
Figure 2H:
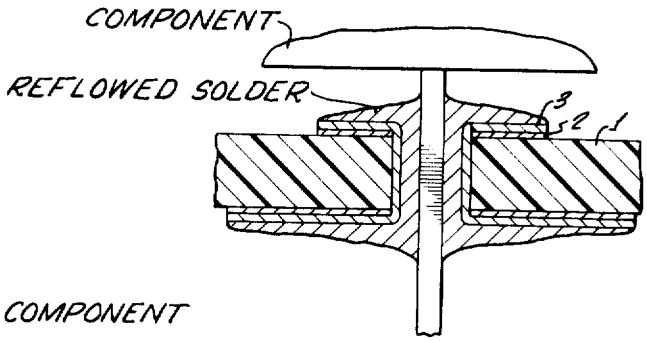

Up to this point, except for solder pattern differences and hole size, the steps are the same as those for making the conventional board. At this point however, an additional thick layer of solder 20 is electroplated at those places where components are to be attached, i.e., around the holes 15. In a typical application the thickness of this layer of solder is approximately 0.006 inches. After this phase of the process, the board will appear as shown in FIG. 2*e*. The board is then immersed in a chemical bath so as to etch away the exposed copper — the completed board having the appearance shown in FIG. 2*f* and 2*g*, i.e., there is an additional layer 20 of solder in the vicinity of the hole 15 which, upon reheating, is available to flow around the terminal of a component as shown in FIG. 2*h*.

After the board is complete, the components and modules can be added by an assembler. Heat is then applied to the board over a fairly large area which causes the solder pattern laid down by the first and second electroplating process to melt. The extra liquid solder flows around the component terminals to make a reliable electrical connection. The terminals of the component are thus "batch" soldered to the printed wiring board.

There are several methods presently available for batch soldering of circuit boards. These include a hot batch oven, hot air jet, hot oil dipping, hot oil waving and various techniques for infra-red and induction soldering. As these processes are already known in the art, a description of their operation is not included herein.

While the board itself is more costly both because of the increased complexity of the electroplating pattern and the additional steps required — this cost is more than offset by the saving in assembly time which results from the abrogation of individual soldering and/or solder preform loading operations.

The basic concept of the invention is of course, not limited to use with wiring boards or circuit boards in general. It may find application in any case where electrical connections are required to be made to a number of different points. Thus, although a preferred embodiment of the present invention has been shown and described, it will be understood that the invention is not limited thereto — and that numerous changes, modifications and substitutions may be made without departing from the spirit of the invention.

We claim:

1. A method for manufacturing printed circuit boards comprising:

laying down a cladding of copper on a insulating substrate board;

drilling terminal holes through the clad board;

plating a layer of copper over the clad board;

electroplating a solder pattern on the plated cladding to interconnect component terminals;

electroplating additional solder at only those locations in the solder pattern where connections to component terminals are to be made;

etching away the exposed copper to leave an electroplated solder pattern.

2. The method recited in claim 1 wherein is included the steps of:

inserting component terminals through the holes;

applying heat over a distributed area of the board whereby the electroplated solder will be melted and the additional solder where the terminals are connected will form a solder connection to the component terminals.

3. The method recited in claim 2 wherein the heat is applied using a hot air jet.

4. The method recited in claim 2 wherein the heat is applied using a hot oil bath.

5. The method recited in claim 2 wherein the heat is applied using a hot oil waving process.

6. A process for making a printed wiring boards of the type having an electroplated solder pattern and plated holes for attaching modular components wherein the improvement comprises the steps of:

plating an additional layer of solder only in the vicinity of those holes where electrical connections are to be made to component terminals.

7. The improved process for making printed wiring boards recited in claim 6 wherein is included the steps of:

inserting the component leads into the plated holes;

batch reflowing the deposited solder to make the electrical connection to the component terminals.

* * * * *